United States Patent [19]

Hegner et al.

[11] Patent Number: 5,539,611
[45] Date of Patent: Jul. 23, 1996

[54] INTERFACE CONNECTION THROUGH AN INSULATING PART

[75] Inventors: Frank Hegner, Lörrach; Thomas Klähn, Freiburg Br., both of Germany

[73] Assignee: Endress u Hauser GmbH u Co., Germany

[21] Appl. No.: 981,781

[22] Filed: Nov. 25, 1992

Related U.S. Application Data

[63] Continuation of Ser. No. 878,516, May 5, 1992, abandoned.

[30] Foreign Application Priority Data

May 26, 1991 [EP] European Pat. Off. ............ 91108553.8

[51] Int. Cl.⁶ ....................................... H01G 7/00
[52] U.S. Cl. ................. 361/283.4; 73/724; 174/152 GM
[58] Field of Search ................................ 361/283.4, 278;
174/262, 263, 267, 50.61, 265, 152 GM;
29/837–840, 845; 228/124.6; 219/85.2,
85.21, 85.22; 73/715, 718, 724

[56] References Cited

U.S. PATENT DOCUMENTS

| | | | |
|---|---|---|---|
| 3,065,533 | 11/1962 | Dungan | 174/152 GM |
| 3,901,772 | 8/1975 | Guillotin | 174/152 GM |
| 4,131,088 | 12/1978 | Reddy | 73/719 |
| 4,207,604 | 6/1980 | Bell | 361/283.4 |
| 4,217,137 | 8/1980 | Kraska | 174/152 GM |
| 4,287,553 | 9/1981 | Braunlich | 361/283.4 |
| 4,287,772 | 9/1981 | Mounteer et al. | 73/720 |
| 4,454,440 | 6/1984 | Cullen | 310/313 R |
| 4,598,470 | 7/1986 | Doughterty | 29/837 |
| 4,631,821 | 12/1986 | Houser | 29/845 |
| 4,661,654 | 4/1987 | Strobel | 29/852 |
| 4,774,626 | 9/1988 | Charboneau et al. | 361/283.4 |
| 5,012,672 | 5/1991 | McKee | 73/31.07 |
| 5,050,034 | 9/1991 | Hegner et al. | 361/283.4 |
| 5,241,216 | 8/1993 | Webster | 257/762 |

FOREIGN PATENT DOCUMENTS

| | | |
|---|---|---|
| 946074 | 7/1956 | Germany . |
| 54-25651 | 8/1979 | Japan . |
| 56-5023 | 2/1981 | Japan . |
| 62-167426 | 7/1987 | Japan . |
| 62-281218 | 12/1987 | Japan . |
| 225448 | 5/1943 | Switzerland . |
| 1587253 | 4/1981 | United Kingdom . |
| WO90/11610 | 10/1990 | WIPO . |

*Primary Examiner*—Bot L. Ledynh
*Attorney, Agent, or Firm*—Barnes & Thornburg

[57] ABSTRACT

This interface connection through a hole (2) in a high-temperature-resistant and vacuum-proof insulating part (1), particularly of ceramic, glass, or a single crystal, consists of a metallic lead (4, 17) inserted into the hole (2) and having a coefficient of thermal expansion less than that of the insulating part (1), wherein at least one end of the lead, if it is flush with at least one surface of the insulating part, is covered with active brazing material which high-vacuum-seals it to the insulating part, or, if it projects beyond at least one surface of the insulating part, is high-vacuum-sealed to the insulating part by means of ring-shaped active brazing material (5'), since in the liquid phase, the active brazing material moves into the gap between the wall of the hole (2) and the lead (4, 17) due to capillary action. Thus, the available materials (insulating material, metals having a smaller coefficient of thermal expansion than the insulating part, active brazing materials) can be used in a different and novel manner such that the use of a lead covered with active brazing material can be dispensed with.

14 Claims, 4 Drawing Sheets

INTERFACE CONNECTION THROUGH AN INSULATING PART

This is a continuation of application Ser. No. 07/878,516 filed May 5, 1992, now abandoned.

FIELD OF THE INVENTION

The present invention relates to an interface connection through a hole in a high-temperature-resistant and vacuum-proof insulating part, to a use of said interface connection in a pressure sensor, and to a method of producing said interface connection.

BACKGROUND OF THE INVENTION

Applicant's WO-A 90/11610, corresponding to U.S. application Ser. No. 07/496,460, describes an interface connection through a hole in an insulating part (referred to there as "electrically conductive feedthrough connection") which consists of a lead brazed into the hole and covered with active brazing material, the core of this lead having a coefficient of thermal expansion less than that of the insulating part.

The tightness of the interface connection, particularly if the insulating part is made of ceramic, glass, or single crystals, is essentially determined by the fact that after the active brazing material has cooled down, the insulating part must not be subjected to excessive tensile forces, since such forces would disrupt the structure of the material, thus making the joint between insulating part and lead leaky at this point.

Since, in the prior art arrangement, there is a certain choice of materials for the lead core which have a smaller coefficient of thermal expansion than the insulating part, and since it is difficult to make the coefficent of thermal expansion of active brazing materials smaller than that of the insulating part, the thickness of the covering of active brazing material and the diameter of the lead core or the ratio of the diameter of the lead core to that of lead as a function of the diameter of the hole must be carefully adapted to one another within very close limits; it may be necessary to implement such a small thickness of the covering of active brazing material that lead covered with active brazing material can only be produced with difficulty and at high cost.

Further prior art, which was partly published already a long time ago, only generally suggests to provide the insulating part with burnt-in metal areas—which is precisely what is to be avoided—or to solder the insulating part to the lead after deposition of metal on the insulating part (DE-C 946 074), or to braze a ceramic tubule into a stainless-steel tube of greater diameter by means of a titanium ring (GB-A 15 87 253). After the brazing, the titanium ring forms a brazing bead without the titanium having penetrated into the gap between the two tubes. In the case of the capacitor disclosed in CH-A 225 448, a similar brazing bead is present whose material has not penetrated into the gap between lead and insulating part, either.

To achieve vacuum tightness and avoid cracking in the cooled-down brazed joint, however, it is absolutely essential that the inside surfaces of the gap be brazed by the active brazing material. Consequently, the brazing material must move there, which can only be caused by capillary action. The latter is counterbalanced by the surface tension, however.

Since, furthermore, to avoid brittleness of the brazed joint, the proportion of active metal—this is at least one reactive element such as titanium, zirconium, beryllium, hafnium or tantalum—in the active brazing alloy can only be made so large that the insulating part will be just sufficiently wetted, the way shown by the abovedescribed prior art seemed impracticable to the inventors, because it did not result in the gap being wetted.

It is, therefore, an object of the invention to apply the available materials (insulating material; metals having a smaller coefficient of thermal expansion than the insulating part; active brazing materials) in a different and novel manner such that the covering of the lead with active brazing material can be dispensed with.

SUMMARY OF THE INVENTION

To attain this object and solve the problems described, the invention, as claimed in claim 1, consists in an interface connection through a hole in a high-temperature-resistant and vacuum-proof insulating part, particularly of ceramic, glass, or a single crystal, which interface connection consists of a metallic lead inserted into the hole and having a coefficient of thermal expansion less than that of the insulating part, wherein at least one end of the lead, if it is flush with at least one surface of the insulating part, is covered with active brazing material which high-vacuum-seals it to the insulating part, or, if said end projects beyond at least one surface of the insulating part, is high-vacuum-sealed to the insulating part by means of ring-shaped active brazing material.

As claimed in claim 5, the invention further consists in a use of this interface connection in a pressure sensor comprising a diaphragm and a substrate which have spaced-apart, flat inner surfaces provided with at least one conductive layer for forming at least one capacitor or with at least one resistive layer for forming at least one strain gage and electrically connected to the respective rear side via an interface connection which is flush with said inner surface.

As claimed in claim 6, the invention finally consists in a method of producing an interface connection through a hole in a high-temperature-resistant and vacuum-proof insulating part, particularly of ceramic, glass, or a single crystal, which interface connection consists of a metallic lead inserted into the hole and having a coefficient of thermal expansion less than that of the insulating part, wherein at least one end of the lead, if it is flush with at least one surface of the insulating part, is covered with active brazing material which high-vacuum-seals it to the insulating part, or, if said end projects beyond at least one surface of the insulating part, is high-vacuum-sealed to the insulating part by means of ring-shaped active brazing material, with at least one conductive layer provided on at least one of the surfaces of the insulating part and making contact to the lead, said method comprising the following features: depositing the conductive layer on the insulating part provided with the hole, which has a spot facing on the conductive-layer side, such that the conductive layer extends into the hole;

inserting the lead into the hole;
  widening that end of the lead which is located on the conductive-layer side, such that said end and the conductive layer extending into the hole are cold-welded together;
  depositing a sufficient amount of active brazing paste; and
  heating in a vacuum or in a gas atmosphere to a temperature above the melting point of the active brazing material until the latter has completely melted, and subsequently allowing it to cool down.

To the inventors it was extremely surprising that with an active-metal content just sufficient for wetting the point of contact with the active brazing material, it is possible to achieve penetration of the active brazing material into the gap between the lead and the insulating part and simultaneously wet the two parts, thereby attaining the desired vacuum tightness. The wetting takes place over the entire penetration depth and area of the active brazing material drawn into the gap, which means that in the gap, the brazing material is not deprived of active metal and, thus, not unwetted.

In one embodiment of the invention, the lead has a diameter which, for diameters of the hole less than 1 mm, is approximately 2% to 15% smaller than the diameter of the hole.

In another embodiment of the invention, the insulating part has on at least one of its surfaces a conductive layer which makes contact to the lead. Preferably, the conductive layer may be of tantalum, and the lead may be of tantalum, molybdenum, tungsten, or an iron-nickel alloy which also contains cobalt if necessary.

In a preferred embodiment of the method of the invention, the conductive layer is deposited by sputtering.

In another embodiment of the method of the invention, the vacuum has a residual-gas pressure of less than 0.01 μbar (= 1 mPa).

In a further embodiment of the method of the invention, the gas atmosphere has a pressure not exceeding 10 mbars (= 1 kPa), and/or the gas atmosphere consists of an inert gas or a reactive gas or a mixture of inert and/or reactive gases.

BRIEF DESCRIPTION OF THE DRAWINGS

The invention will now be explained by way of example with reference to the accompanying drawings, in which like reference characters have been used to designate like parts.

DETAILED DESCRIPTION OF THE DRAWINGS

Figure 1:
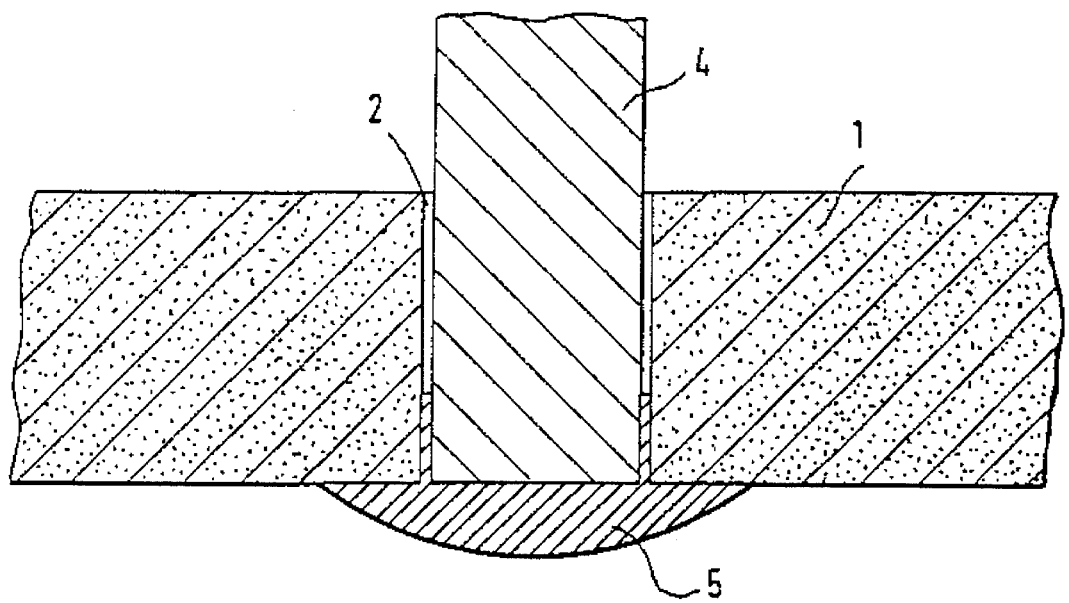
FIG. 1 is a schematic cross-sectional view of a first variant of an interface connection.

FIG. 1 shows the first variant of an interface connection according to the invention in a greatly enlarged schematic cross section. A high-temperature A high-temperature-resistant and vacuum-proof insulating part 1 is provided with a hole 2 of a suitable diameter. The hole 2 contains a lead 4 which has one end flush with the underside of the insulating part 1 and project s at the top side. The flush end of the lead 4 is covered with a sufficient amount of active brazing material 5 and there by high-vacuum-sealed to the insulating part 1. Through capillary action, which preponderates over the surface tension, the active brazing material moves into the hole 2 in its liquid phase, so that after the brazing material has cooled down, a permanent joint is formed which is resistant to sudden changes in temperature and to thermal shock.

Figure 2:
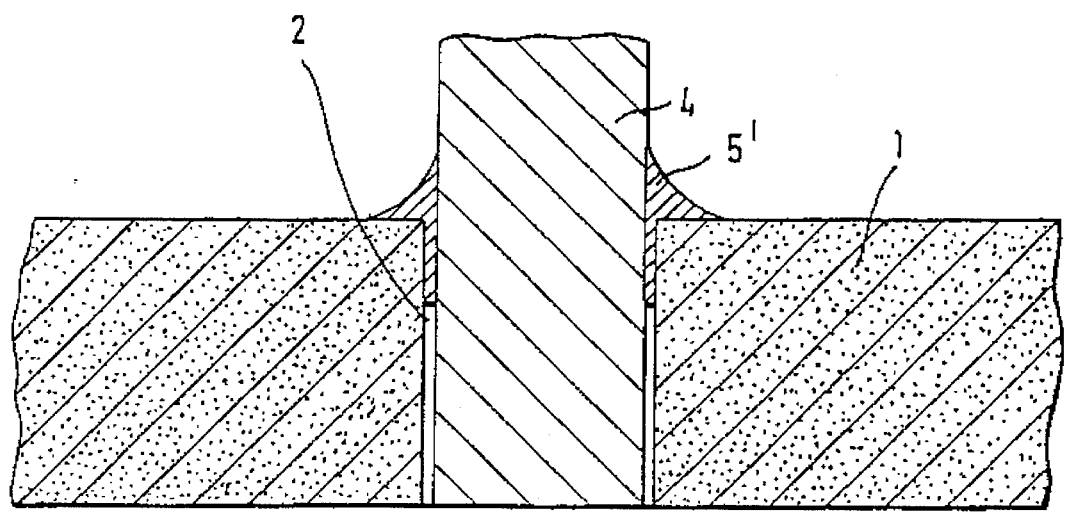
FIG. 2 is a schematic cross-sectional view of a second variant of an interface connection.

FIG. 2 shows the second variant of an interface connection according to the invention in a greatly enlarged schematic section. A high-temperature-resistant and vacuum-proof insulating part 1 is again provided with a hole 2 of a suitable diameter. The hole 2 contains a lead 4 which has one end flush with the underside of the insulating part 1 and projects at the top side. At this point, the lead 4 is surrounded by a sufficient amount of ring-shaped active brazing material 5' and thereby high-vacuum-sealed to the insulating part 1. In this variant, too, capillary action, which preponderates over the surface tension, causes the active brazing material to move into the hole 2 in its liquid phase, so that after the brazing material has cooled down, a permanent joint is again obtained which is resistant to sudden changes in temperature and to thermal shock.

Figure 3:
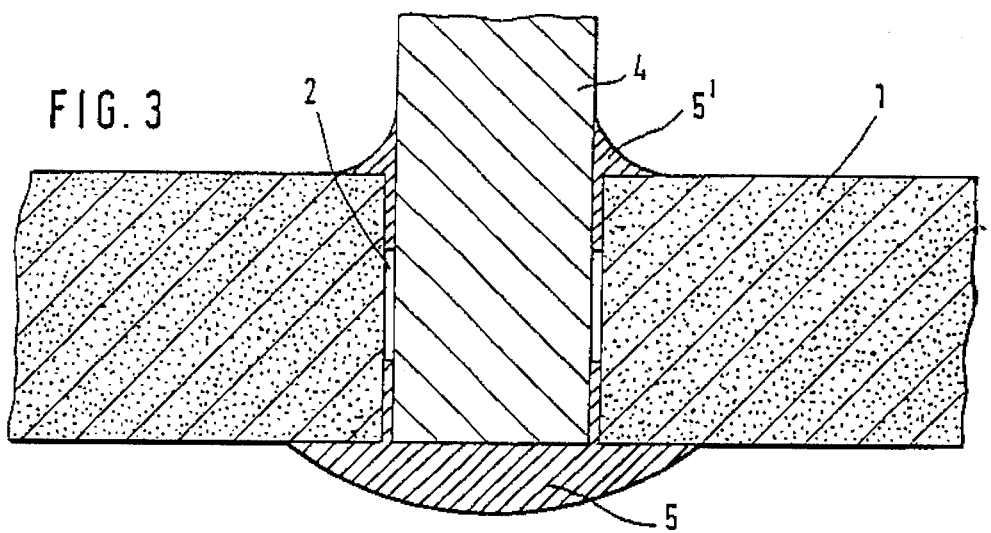
FIG. 3 is a schematic cross-sectional view of an interface connection using both variants.

FIG. 3 shows the use of the two above-explained variants at the top side and the underside of an insulating part 1. This results in a particularly firm and—in the above sense—resistant joint, since both at the underside and at the top side, active brazing material penetrates into the narrow gap between the wall of the hole 2 and the lead 4 due to capillary action.

Figure 4:
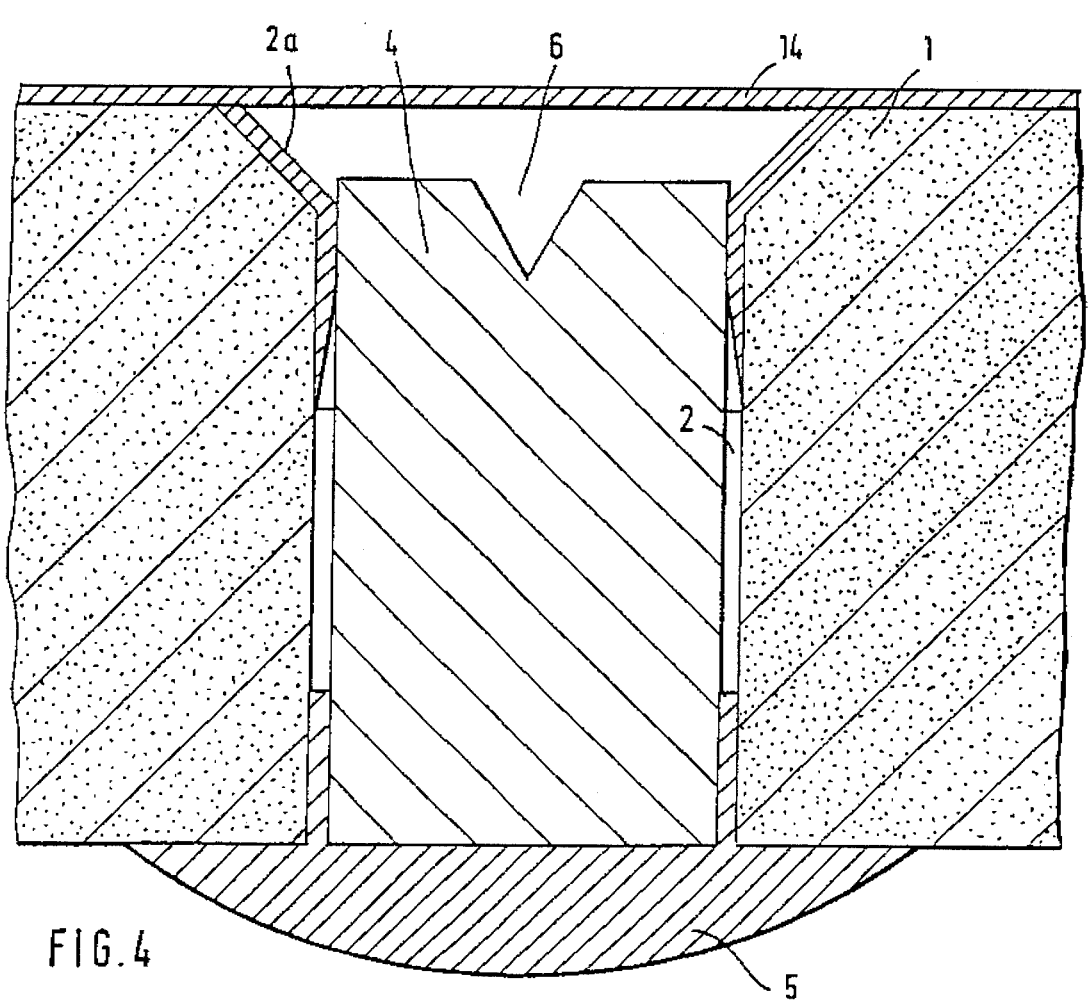
FIG. 4 is a schematic cross-sectional view of a further development of the first variant of an interface connection.

In a further development of the invention, shown in FIG. 4 in a greatly enlarged cross section, the hole 2 has a spot facing 2a at one of its ends. The surface provided with the spot facing is covered with a conductive layer 14 which also extends into the hole and, gradually becoming thinner, ends there. The hole 2 again contains a lead 4. By a notch 6 it is indicated that the lead 4 is widened in the area of the spot facing 2a such that the conductive layer 14 extending into the hole is cold-welded to the lead 4 all around the latter. The widening may be achieved, for example, by means of a pricklike punch, but also by simple compression using a blunt punch.

The other end of the lead 4 is flush with that surface of the insulating part 1 which faces away from the surface supporting the conductive layer 14. It is again covered with active brazing material 5 and brazed to this surface of the insulating part 1 and, through capillary action, within the hole 2.

Figure 5:
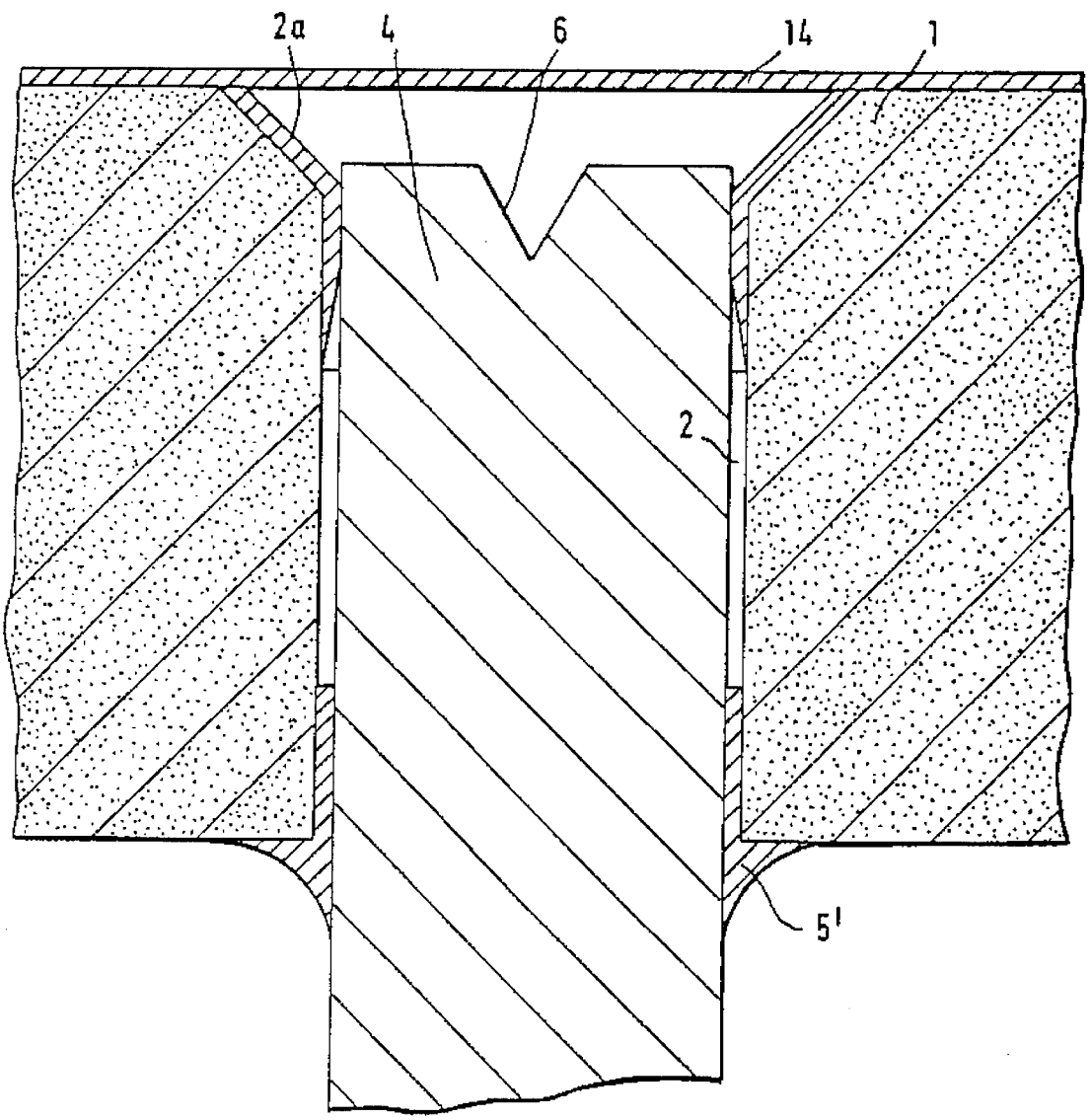
FIG. 5 is a schematic cross-sectional view of a further development of the second variant of an interface connection.

In a further development of the invention, shown in FIG. 5 in a greatly enlarged cross section, the design at the top side of the insulating part 1 is identical to that of FIG. 4. At the underside of the insulating part 1, however, the lead 4 juts out and is therefore brazed to the insulating part 1 by means of the ring-shaped active brazing material 5' and within the hole 2 by capillary action.

In the further developments shown in FIGS. 4 and 5, the interface connection according to the invention is produced as follows.

The insulating parts, prefabricated with the necessary or desired number of holes and spot facings, are provided with conductive layers on the spot-faced side, e.g., by sputtering or vapor deposition, such that the conductive-layer metal also extends into the holes, i.e., that the surfaces of the holes are metallized from the mouth portions inwards;

then, leads are inserted into the holes or, during mass production, filled into the holes, e.g., by vibrating a magazine holding the insulating parts—in any case, the hole diameters and lead diameters are so adapted to each other that the leads can be introduced into the holes without appreciable effort;

next, that end of each lead which is located on the conductive-layer side is widened such that the conductive layer extending into the conductive hole is cold-welded to the respective lead all around the latter—the widening is done, for example, with a suitable press tool or otherwise;

thereafter, to form the respective brazed joint, sufficient amounts of an active brazing paste having the desired composition are applied to those ends of the leads which are flush with the non-spot-faced surface, the active brazing paste adhering there because of its pastiness, or ring-shaped active brazing paste beads are formed around those ends of the leads which project beyond the non-spot-faced surface, and finally, the insulating parts thus prepared are heated, in a vacuum or a suitable gas atmosphere, to a temperature above the melting point of the active brazing paste or beads until the active brazing material has completely melted, whereupon it is allowed to cool down.

Active brazing paste may be applied by printing, in which case quantity and layer thickness are easily reproducible, or by dispensing in precisely measured quantities, depending on the application. In addition, because of the adhesion properties of the active brazing paste, the parts to be brazed can be precisely positioned and fixed in place.

Figure 6:
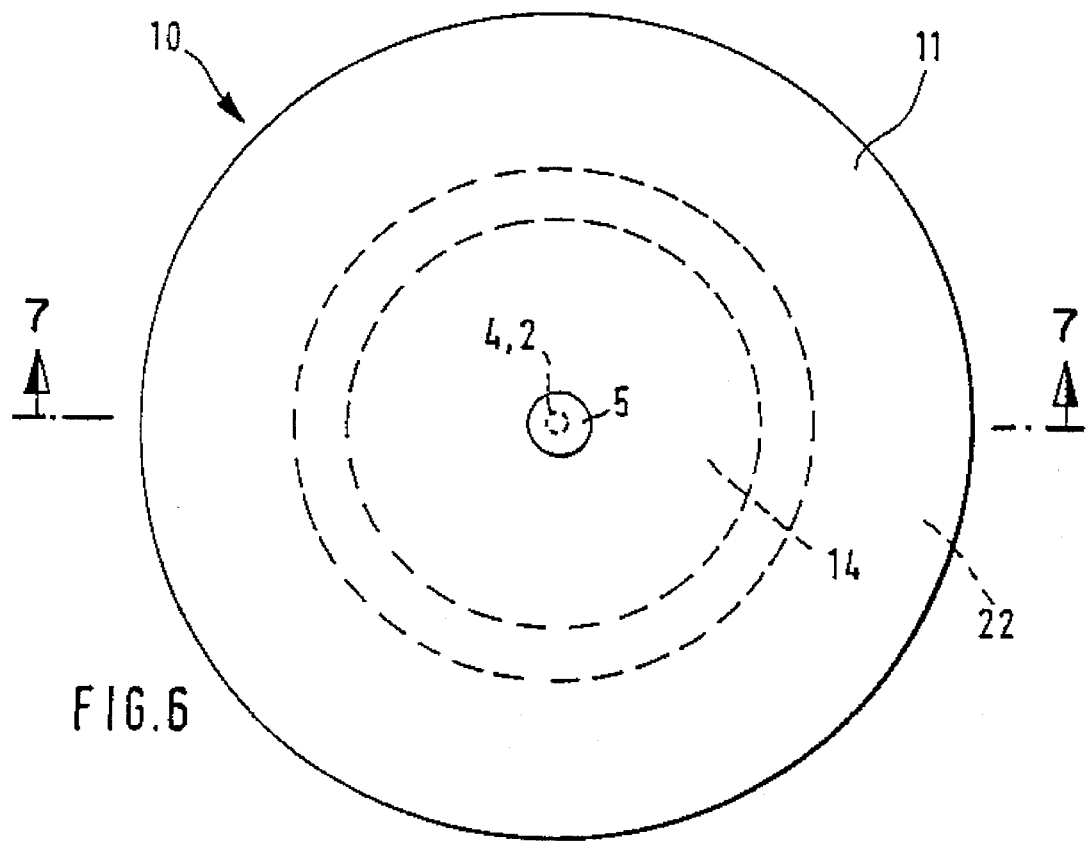
FIG. 6 is a plan view of a capacitive pressure sensor with interface connections.
Figure 7:
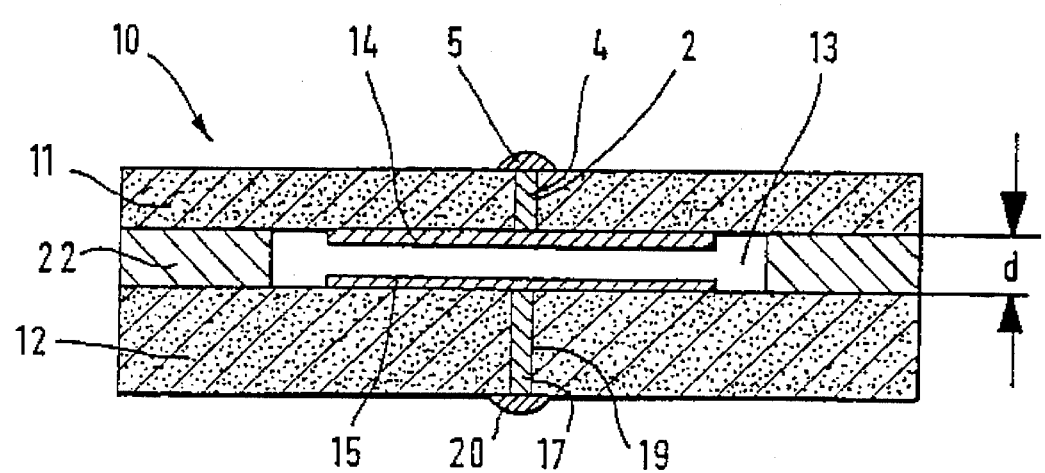
FIG. 7 is a schematic cross section taken along line A-B of FIG. 6.

The interface connection according to the invention can be used to advantage in a capacitive or resistive pressure sensor. The structure of such a capacitive pressure sensor 10 is shown schematically in FIGS. 6 and 7. The pressure sensor 10 has a diaphragm 11 in the form of a circular disk having plane-parallel surfaces which is joined around the periphery, e.g., by means of a preform of active brazing material, to a circular substrate 12 so as to be separated from the latter by a defined distance d. In this way, a high-vacuum-sealed chamber 13 is formed between the top side of the substrate 12 and the opposite surface of the diaphragm 11.

Diaphragm 11 and substrate 12 are insulating parts, particularly ceramic parts. The diaphragm is elastic and will deform when a force or pressure is applied to it. On those surfaces of the diaphragm add the substrate which face each other, circular conductive layers 14, 15 of a suitable metal are deposited within the chamber 13, e.g., by sputtering or vapor deposition. Connected to the conductive layers 14' and 15 are the leads 4 and 17, respectively, as explained with the aid of FIG. 1, with the lead 17 secured in a hole 19 of the substrate 12 by means of active brazing material 20.

The two conductive layers 14, 15 form the electrodes of a capacitor whose capacitance depends on the distance between the conductive layers. When the diaphragm 11 deforms under the action of a force or under pressure, this distance changes, thereby changing the capacitance of the pressure sensor. This capacitance can be measured by means of an electronic circuit connected to the leads 4, 17. By dividing the conductive layers into inner circular areas and outer circular areas spaced from the latter, more than only one capacitor can be implemented.

In a resistive pressure sensor, at least one resistive layer is present instead of the metallic conductive layer 14. Electrical contact is made to it by means of suitable interface connections, while the conductive layer 15 is omitted.

Particularly suitable materials for the insulating part 1 are ceramic, glass or single crystals, e.g., sapphire. A preferred ceramic is alumina ceramic, particularly one of 96% purity, as is used in the pressure sensors described above.

Suitable materials for the lead 4 and/or the lead 17 are metals such as tantalum, molybdenum, tungsten, rhenium, osmium or iron-nickel alloys which may also contain cobalt, such iron-nickel-cobalt alloys being commercially available under the trade name Kovar or Vacon, for example. All of these metals have a smaller coefficient of thermal expansion than the above-mentioned alumina ceramic (= 7 ppm/K).

A particularly suitable material for the conductive layers 14, 15 is tantalum, as is described for the abovementioned capacitive pressure sensors in applicant's prior European Patent Application 90 12 2994.8, corresponding to U.S. application Ser. No. 07/570,312now U.S. Pat. No. 5,05,034.

Suitable materials for the active brazing material 5, 5', 20 are silver, silver-copper or silver-copper-indium alloys to which is added at least one reactive element, such as titanium, zirconium, beryllium, hafnium or tantalum. Thus, the active brazing material or active brazing paste is, for example, a silver-titanium, silver-copper-titanium or silver-copper-indium-titanium alloy.

As mentioned above, in one embodiment of the invention, the lead 4, 17 has a diameter which, for diameters of the hole 2 less than 1 mm, is approximately 2% to 15% smaller than the diameter of the hole. The diameter of a tantaium lead, for example, will be not more than 10% smaller than that of the hole 2 in an insulating part 1 of zirconium oxide or not more than 5% smaller than that of the hole 2 in an insulating part 1 of alumina or not more than 3% smaller than that of the hole 2 in an insulating part 1 of silicon carbide.

In a ceramic substrate where the hole 2 is about 0.65 mm in diameter and the width of the gap between lead 4 and insulating part 1 is 20 μm, the penetration depth of the active brazing material will be approximately 2 mm.

We claim:

1. An interface connection through a hole in a high-temperature-resistant and vacuum-proof insulating part, the insulating part being selected from the group consisting of ceramic, glass, and a single crystal, which interface connection comprises a metallic lead inserted into the hole and having a coefficient of thermal expansion less than that of the insulating part, wherein at least one end of the lead is flush with at least one surface of the insulating part, covered with an active brazing material, and high-vacuum brazed into the hole, the active brazing material consisting essentially of a metal and an active metal and with the active metal content just sufficient for wetting the points of contact with the insulating part and nevertheless entering and moving into the hole around the lead due to capillary action and simultaneously wetting the lead and the hole.

2. An interface connection as claimed in claim 1 wherein, for diameters of the hole less than 1 mm, the diameter of the lead is approximately 2% to 15% smaller than the diameter of the hole.

3. An interface connection as claimed in claim 1 wherein the insulating part has on at least one of its surfaces at least one conductive layer which makes contact to the lead.

4. An interface connection as claimed in claim 3 wherein the conductive layer is of tantalum and the lead is of tantalum, molybdenum, tungsten, or an iron-nickel alloy.

5. An interface connection as claimed in claim 1 wherein the insulating part is a pressure sensor comprising a diaphragm and a substrate which have spaced-apart, flat inner surfaces provided with at least one conductive layer for forming at least one capacitor or with at least one resistive layer for forming at least one strain gage and electrically connected to the respective rear side via the interface connection which is flush with said inner surface.

6. An interface connection as claimed in claim 4 wherein the lead also contains cobalt.

7. An interface connection as claimed in claim 2 wherein the insulating part has on at least one of its surfaces at least one conductive layer which makes contact to the lead.

8. An interface connection through a hole in a high-temperature-resistant and vacuum-proof insulating part, the insulating part being selected from the group consisting of ceramic, glass, and a single crystal, which interface connection comprises a metallic lead inserted into the hole and having a coefficient of thermal expansion less than that of the insulating part, wherein at least one end of the lead projecting beyond one surface of the insulating part is high-vacuum brazed by an active brazing material into the hole, the active brazing material consisting essentially Of a metal and an active metal and with the active metal content just sufficient for wetting the points of contact with the insulating part and including a ring-shaped amount of an active brazing material around said end of the lead which enters and moves into the hole by capillary action during the brazing to simultaneously wet the lead and the hole.

9. The interface connection as claimed in claim 8 wherein, for diameters of the hold less than 1 mm, the diameter of the lead is approximately 2% to 15% smaller than the diameter of the hole.

10. The interface connection as claimed in claim 8 wherein the insulating part has on at least one of its surfaces at least one conductive layer which makes contact to the lead.

11. The interface connection as claimed in claim 10 wherein the conductive layer is of tantalum and the lead is of tantalum, molybdenum, tungsten, or an iron-nickel alloy.

12. The interface connection as claimed in claim 8 wherein the insulating part is a pressure sensor comprising a diaphragm and a substrate which have spaced-apart, flat inner surfaces provided with at least one conductive layer for forming at least one capacitor or with at least one resistive layer for forming at least one strain gage and electrically connected to the respective rear side via the interface connection which is flush with said inner surface.

13. The interface connection as claimed in claim 11 wherein the lead also contains cobalt.

14. The interface connection as claimed in claim 9 wherein the insulating part has on at least one of its surfaces at least one conductive layer which makes contact to the lead.

* * * * *